United States Patent
Oh et al.

(10) Patent No.: US 11,588,494 B2
(45) Date of Patent: Feb. 21, 2023

(54) SAMPLE-AND-HOLD AMPLIFIER AND SEMICONDUCTOR DEVICE INCLUDING THE SAME

(71) Applicant: SK hynix Inc., Gyeonggi-do (KR)

(72) Inventors: Joo Won Oh, Gyeonggi-do (KR); Keun Jin Chang, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/354,198

(22) Filed: Jun. 22, 2021

(65) Prior Publication Data
US 2022/0271767 A1    Aug. 25, 2022

(30) Foreign Application Priority Data
Feb. 22, 2021    (KR) .................. 10-2021-0023349

(51) Int. Cl.
  *H03M 1/10*    (2006.01)
  *H03M 1/12*    (2006.01)
  *G11C 27/02*    (2006.01)
  *H03M 1/46*    (2006.01)
  *H03M 1/06*    (2006.01)

(52) U.S. Cl.
  CPC ......... *H03M 1/1245* (2013.01); *G11C 27/026* (2013.01); *H03M 1/0607* (2013.01); *H03M 1/468* (2013.01)

(58) Field of Classification Search
  CPC ... H03M 1/1245; H03M 1/0607; H03M 1/468
  USPC .................. 341/118, 120, 155, 144, 163, 122
  See application file for complete search history.

(56) References Cited

U.S. PATENT DOCUMENTS

| | | | | | |
|---|---|---|---|---|---|
| 5,594,445 | A | * | 1/1997 | Ginetti ................ | H03M 1/0682 341/162 |
| 7,504,977 | B2 | * | 3/2009 | Doorenbos ............. | H03M 3/46 341/172 |

FOREIGN PATENT DOCUMENTS

KR    10-1158177 B1    6/2012
KR    10-2014-0023157 A    2/2014

\* cited by examiner

*Primary Examiner* — Peguy Jean Pierre
(74) *Attorney, Agent, or Firm* — IP & T Group LLP (57) ABSTRACT

A sample-and-hold amplification circuit can include a sampling circuit configured to sample first and second input signals in response to first and second control signals to generate first and second sampled signals, an amplification circuit configured to amplify a voltage difference between the first and second sampled signals to generate first and second output signals, and an offset compensation circuit configured to form a first path between input and output terminals of the amplification circuit in response to the first control signal to store an offset of the input terminal and form a second path between the input and output terminals in response to the second control signal to reflect the offset to the output terminal.

16 Claims, 6 Drawing Sheets

WAVEFORMS WITH DISTORTION CAUSED BY OFFSET

FIG. 5B

WAVEFORMS WITH OFFSET COMPENSATION

SAMPLE-AND-HOLD AMPLIFIER AND SEMICONDUCTOR DEVICE INCLUDING THE SAME

CROSS-REFERENCE TO RELATED APPLICATIONS

This patent application claims the benefit of Korean Patent Application No. 10-2021-0023349, filed on Feb. 22, 2021, the entire disclosure of which is incorporated herein by reference.

TECHNICAL FIELD

One or more embodiments of the present disclosure described herein relate to a semiconductor design, and more particularly, to a sample-and-hold amplifier circuit configured to compensate for an offset, and a semiconductor device in which the same is embedded.

BACKGROUND

Recently, a paradigm for a computing environment has shifted to ubiquitous computing, which enables computer systems to be accessed virtually anytime and anywhere. As a result, the use of portable electronic devices (e.g., mobile phones, digital cameras, notebook computers, or the like) are rapidly increasing. Such portable electronic devices each may use or include a memory system having at least one memory device. As the market for a portable System-On-Chip (SoC) products is growing, sizes and power consumption of semiconductor devices embedded in the portable SoC products may become a factor for showing product competitiveness.

Specifically, as a process of the semiconductor device becomes more refined and a high-speed operation is required, a temperature change can greatly affect characteristics and performance of the semiconductor device. In order to measure such a temperature change, the semiconductor device may use a thermistor whose resistance value varies depending on temperature or a complementary metal-oxide semiconductor (CMOS) device having characteristics of Proportional To Absolute Temperature (PTAT) and Complementary To Absolute Temperature (CTAT).

A temperature sensing circuit using a CMOS device may generate an output voltage based on a threshold voltage of a transistor, which changes with temperature. The temperature sensing circuit may include an analog-to-digital conversion (ADC) circuit for converting an analog signal corresponding to the output voltage into a digital signal. Further, in order to sample and amplify the analog signal without distortion, the CMOS device has a sample-and-hold amplifier at the input terminal of the ADC circuit, to reduce an effect caused by a jitter of the clock and a parasitic element of internal circuits

BRIEF DESCRIPTION OF THE DRAWINGS

The description herein makes reference to the accompanying drawings wherein like reference numerals refer to like parts throughout the figures.

DETAILED DESCRIPTION

Various embodiments of the present disclosure are described below with reference to the accompanying drawings. Elements and features of the present disclosure, however, may be configured or arranged differently to form other embodiments, which may be variations of any of the disclosed embodiments.

In this disclosure, references to various features (e.g., elements, structures, modules, components, steps, operations, characteristics, etc.) included in "one embodiment," "example embodiment," "an embodiment," "another embodiment," "some embodiments," "various embodiments," "other embodiments," "alternative embodiment," and the like are intended to mean that any such features are included in one or more embodiments of the present disclosure, but may or may not necessarily be combined in the same embodiments.

In this disclosure, the terms "comprise," "comprising," "include," and "including" are open-ended. As used in the appended claims, these terms specify the presence of the stated elements and do not preclude the presence or addition of one or more other elements. The above terms in a claim do not foreclose the apparatus from including additional components (e.g., an interface unit, circuitry, etc.).

As used herein, the terms "first," "second," "third," and so on are used as labels for nouns that the terms precede, and do not imply any type of ordering (e.g., spatial, temporal, logical, etc.). The terms "first" and "second" do not necessarily imply that the first value must be written before the second value. Further, although the terms may be used herein to identify various elements, these elements are not limited by these terms. These terms are used to distinguish one element from another element that otherwise have the same or similar names. For example, a first circuitry may be distinguished from a second circuitry.

Further, the term "based on" is used to describe one or more factors that affect a determination. This term does not foreclose additional factors that may affect a determination. That is, a determination may be solely based on those factors or based, at least in part, on those factors. Consider the phrase "determine A based on B." While in this case, B is a factor that affects the determination of A, such a phrase does not foreclose the determination of A from also being based on C. In other instances, A may be determined based solely on B.

As used in the specification and claims, the expression "at least one", in reference to a list of one or more elements, should be understood to mean at least one element selected from one or more of the included elements in the list of items, but not necessarily including the minus one of each and every one of the elements included in the list and without excluding any combination of these elements. This definition also allows the possibility that elements other than those identified in the list to which the expression "at least one" refers to may be present, regardless of whether or not the other elements are related to the identified elements.

Thus, for example, "at least one of A and B" (either "at least one between A or B" or "at least one of A and/or B") may refer in one embodiment to at least one A (with the possibility that it includes more than one) and no B (with the possibility that it includes elements other than B), in another embodiment at least one B and no A (with the possibility that it includes elements other than A), in another embodiment to at least one A (with the possibility that it includes more than one) and at least one B (with the possibility that it includes more than one), etc.

If it is indicated that one element is "on" another, it can be interpreted that it is directly on the other element or that there are also other elements between them. On the contrary, if it is indicated that one element is "directly on" another, there can be no other elements between them. Likewise, if it is indicated that an element is "connected", "joined" or "coupled" to another, it should be understood that it can be connected, joined or coupled directly to the other element or that there are other elements in between. On the contrary, if it is indicated that one element is "directly connected", "directly linked" or "directly coupled" to another, there can be no other elements in between. Although an item is described or shown with reference to one embodiment, such an item may be included in other embodiments as well. Those skilled in the art will also understand that references to a structure or element that is "next to" another element may have parts that are above or covered by said element.

An embodiment of the present disclosure may provide a sample-and-hold amplification circuit which forms different paths between input/output terminals in response to a control signal, so that the sample-and-hold amplification circuit and a semiconductor device using the same may remove, reduce or avoid an effect on an output signal when an offset occurs.

In an embodiment of the present disclosure, a sample-and-hold amplification circuit may include a sampling circuit configured to sample first and second input signals in response to first and second control signals to generate first and second sampled signals; an amplification circuit configured to amplify a voltage difference between the first and second sampled signals to generate first and second output signals; and an offset compensation circuit configured to form a first path between input and output terminals of the amplification circuit in response to the first control signal to store an offset of the input terminal and form a second path between the input and output terminals in response to the second control signal to reflect the offset to the output terminal.

The offset compensation circuit may include an offset storage circuit configured to form the first path between a first input terminal and a second output terminal of the amplification circuit and between a second input terminal and a first output terminal of the amplification circuit, in response to the first control signal; and an offset reflection circuit configured to form the second path between the first input terminal and the first output terminal of the amplification circuit and between the second input terminal and the second terminal of the amplification circuit, in response to the second control signal.

The offset storage circuit may include first and second capacitors individually coupled to the first and second output terminals of the amplification circuit; a first switch coupled between the first capacitor and the second output terminal of the amplification circuit and configured to be turned on in response to the first control signal; and a second switch coupled between the second capacitor and the first output terminal of the amplification circuit and configured to be turned on in response to the first control signal.

The offset reflection circuit may include the first and second capacitors; a third switch coupled between the first capacitor and the first output terminal of the amplification circuit and configured to be turned on in response to the second control signal; and a fourth switch coupled between the second capacitor and the second output terminal of the amplification circuit and configured to be turned on in response to the second control signal.

The offset compensation circuit may include a compensation capacitor which is coupled between the input and output terminals of the amplification circuit via the first path when the first control signal is activated or the second path when the second control signal is activated.

The amplification circuit may include an operational amplifier coupled between the input terminal and the output terminal to generate the first and second output signals; a reset switch turned on in response to the first control signal to form a feedback loop between the input terminal and the output terminal; and a feedback capacitor coupled in parallel with the reset switch between the input terminal and the output terminal.

The compensation capacitor may be coupled in parallel with the feedback capacitor when the second control signal is activated.

The compensation capacitor and the feedback capacitor may have the same capacitance.

The sampling circuit may include a first sampling switch turned on in response to the first control signal to transfer the first and second input signals; a second sampling switch turned on in response to the second control signal to transfer the first and second input signals; and a sampling capacitor between the first and second sampling switches and the amplification circuit.

The first sampling circuit may include a first switch turned on in response to the first control signal to transfer the first input signal to a first capacitor of the sampling capacitor; and a second switch turned on in response to the first control signal to transfer the second input signal to a second capacitor of the sampling capacitor.

The second sampling circuit may include a third switch turned on in response to the second control signal to transfer the first input signal to the second capacitor of the sampling capacitor; and a fourth switch turned on in response to the second control signal to transfer the second input signal to the first capacitor of the sampling capacitor.

The first and second control signals may include two clock signals having phases which are complementary to each other and are not overlapped with each other.

In another embodiment, a semiconductor device may include a temperature sensing circuit configured to generate first and second input signals, wherein a voltage difference between the first and second input signals increases in a proportion to temperature; an amplification circuit configured to amplify the voltage difference between the first and second input signals to generate first and second output signals; and an analog-to-digital conversion circuit configured to convert a voltage difference between the first and second output signals into a digital signal including information of the temperature. The amplification circuit can be further configured to form a first path between input and output terminals of the amplification circuit in response to the first control signal to store an offset of the input terminal and form a second path between the input and output terminals in response to the second control signal to reflect the offset to the output terminal.

The amplification circuit may include an offset storage circuit configured to form the first path between a first input terminal and a second output terminal of the amplification circuit and between a second input terminal and a first output terminal of the amplification circuit, in response to the first control signal; and an offset reflection circuit configured to form the second path between the first input terminal and the first output terminal of the amplification circuit and between the second input terminal and the second output terminal of the amplification circuit, in response to the second control signal.

The amplification circuit may include a compensation capacitor which is coupled between the input and output terminals of the amplification circuit via the first path when the first control signal is activated or the second path when the second control signal is activated.

The amplification circuit can include an operational amplifier coupled between the input terminal and the output terminal to generate the first and second output signals; a reset switch turned on in response to the first control signal to form a feedback loop between the input terminal and the output terminal; and a feedback capacitor coupled in parallel with the reset switch between the input terminal and the output terminal.

The compensation capacitor and the feedback capacitor may have the same capacitance.

The first and second control signals may include two clock signals having phases which are complementary to each other and are not overlapped with each other.

In another embodiment, a semiconductor memory device can include a temperature sensing circuit configured to generate first and second input signals associated with sensing of temperature, the first input signal having a voltage level proportional to the temperature, the second input signal having a reference voltage level; a sample-and-hold amplification circuit configured to sample the first and second input signals to generate first and second sampled signals and amplify a difference between the first and second sampled signals to generate first and second output signals using an operational amplifier; and an analog-to-digital conversion circuit configured to convert the first output signal into digital temperature information by counting the first output signal using the second output signal. The amplification circuit can include a capacitor configured to charge an offset voltage corresponding to a voltage difference between the first and second sampled signals at input terminals of the operational amplifier during a sampling operation, and the amplification circuit reflects the charged offset voltage at output terminals of the operational amplifier during a holding operation to compensate for a voltage difference between the first and second output signals which is compensated by the charged offset voltage.

Embodiments of the present disclosure will now be described with reference to the accompanying drawings, wherein like numbers reference like elements.

Figure 1:
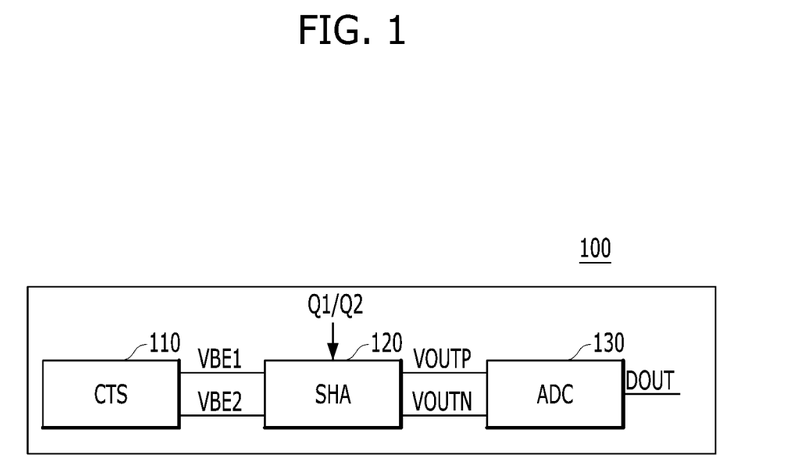
FIG. 1 illustrates a semiconductor device according to an embodiment of the present disclosure.

FIG. 1 illustrates a semiconductor device 100 according to an embodiment of the present disclosure. Referring to FIG. 1, the semiconductor device 100 may include a temperature sensing circuit 110, an amplification circuit 120, and an analog-to-digital conversion (ADC) circuit 130.

The temperature sensing circuit 110 may include a complementary metal-oxide semiconductor (CMOS) temperature sensor (CTS). The temperature sensing circuit 110 may generate a first input voltage VBE1 and a second input voltage VBE2 based on temperature. Herein, according to an embodiment, the first input voltage VBE1 may include a voltage level having a proportional to absolute temperature (PTAT) characteristic that increases in proportion to the temperature, while the second input voltage VBE2 may include a reference voltage level having a constant magnitude regardless of the temperature.

According to another embodiment, the first input voltage VBE1 or the second input voltage VBE2 may include a temperature voltage having a complementary to absolute temperature (CTAT) characteristic that decreases in inverse proportion to the temperature. The temperature sensing circuit 110 may generate positive and negative voltages corresponding to the temperature by using a threshold voltage of a transistor that linearly changes according to a temperature change. In addition, the temperature sensing circuit 110 may include a bandgap reference (BGR) circuit to generate a constant voltage regardless of the temperature change by combining the positive and negative voltages corresponding to the temperature with a specific ratio.

The first input voltage VBE1 and the second input voltage VBE2 generated from the temperature sensing circuit 110 may be considered analog input signals having a voltage difference $\Delta VBE(=VBE1-VBE2)$ which increases in proportion to the temperature. Hereinafter, the first input voltage VBE1 and the second input voltage VBE2 could be referred to as a first analog input signal VBE1 and a second analog input signal VBE2.

The amplification circuit 120 may include a sample-and-hold amplifier (SHA). The amplification circuit 120 may amplify the first analog input signal VBE1 and the second analog input signal VBE2 to generate a first output signal VOUTP and a second output signal VOUTN. The amplification circuit 120 may amplify a voltage difference $\Delta VBE$ between the first analog input signal VBE1 and the second analog input signal VBE2, so that the first output signal VOUTP and the second output signal VOUTN could have a voltage difference $\Delta VOUT(=VOUTP-VOUTN)$ which is adjusted to fall within an input voltage operation range of the ADC circuit 130.

According to an embodiment of the present disclosure, the amplification circuit 120 may receive first and second control signals Q1 and Q2 which have complementary phases. The amplification circuit 120 may form a first path between an input terminal and an output terminal in response to the first control signal Q1 to store an offset generated at the input terminal. The amplification circuit 120 may form a second path between the input terminal and the output terminal in response to the second control signal Q2 to reflect stored offset to the output terminal. The amplification circuit 120 will be described in more detail with reference to FIG. 2.

The ADC circuit 130 may generate digital temperature information DOUT based on the first output signal VOUTP and the second output signal VOUTN which are input from the amplification circuit 120. The ADC circuit 130 may perform analog-to-digital conversion of the first output signal VOUTP based on the second output signal VOUTN. For example, the ADC circuit 130 may count a clock value corresponding to a voltage difference between the first output signal VOUTP and the second output signal VOUTN and convert the counted clock value to the digital temperature information DOUT which is a type of digital signal.

Figure 2:
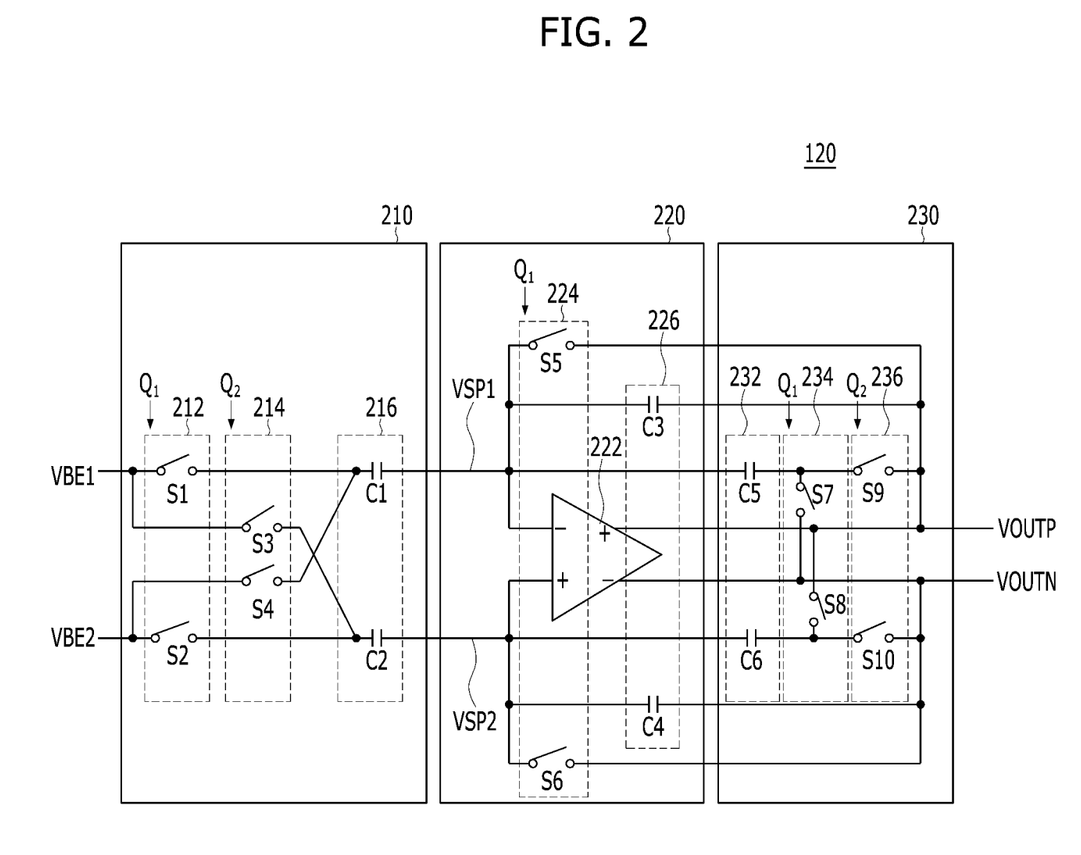
FIG. 2 is a circuit diagram showing a sample and hold amplification circuit according to an embodiment of the present disclosure.

FIG. 2 is a circuit diagram showing a sample and hold amplification circuit according to an embodiment of the present disclosure. The sample and hold amplification circuit may correspond to the amplification circuit 120 shown in FIG. 1. Referring to FIG. 2, the sample and hold amplification circuit may include a sampling circuit 210, an amplification circuit 220, and an offset compensation circuit 230.

The sampling circuit 210 may sample the first and second analog input signals VBE1, VBE2 in response to the first and second control signals Q1, Q2. The sampling circuit 210 may include a first sampling switch 212, a second sampling switch 214, and a sampling capacitor 216.

The first sampling switch 212 may be turned on in response to the first control signal Q1 to transfer the first and second analog input signals VBE1, VBE2. The first sampling switch 212 may include a first switch S1 and a second switch S2. The first switch S1 may be turned on in response to the first control signal Q1 for transferring the first analog input signal VBE1. The second switch S2 may be turned on in response to the first control signal Q1 for transferring the second analog input signal VBE2.

The second sampling switch 214 may be turned on in response to the second control signal Q2 for transferring the first and second analog input signals VBE1, VBE2. The second sampling switch 214 may include a third switch S3 and a fourth switch S4. The third switch S3 may be turned on in response to the second control signal Q2 for transferring the first analog input signal VBE1. The fourth switch S4 may be turned on in response to the second control signal Q2 for transferring the second analog input signal VBE2.

The sampling capacitor 216 may include first and second capacitors C1, C2 coupled between the first and second sampling switches 212, 214 and the amplification circuit 220. The first capacitor C1 may be charged with a voltage corresponding to the first and second analog input signals VBE1, VBE2 transferred by the first and fourth switches S1, S4 for generating a first sampling signal VSP1. The second capacitor C2 may be charged with a voltage corresponding to the second and first analog input signals VBE2, VBE1 transferred by the second and third switches S2, S3 for generating the second sampling signal VSP2.

The amplification circuit 220 may amplify a voltage difference between the first and second sampling signals VSP1, VSP2 to generate the first and second output signals VOUTP, VOUTN. The amplification circuit 220 may include an operational amplifier 222, a reset switch 224, and a feedback capacitor 226.

The operational amplifier 222 may be coupled between the input terminal and the output terminal of the amplification circuit 220. The operational amplifier 222 may receive the first and second sampling signals VSP1, VSP2 through inversion and non-inversion input terminals individually, and amplify received signals to output the first and second output signals VOUTP, VOUTN through positive and negative output terminals.

The reset switch 224 may include fifth and sixth switches S5, S6 which are turned on in response to the first control signal Q1 to form a feedback loop between the input terminal and the output terminal of the operational amplifier 222. The fifth switch S5 may be turned on in response to the first control signal Q1, which is coupled between the inversion input terminal and the positive output terminal of the operational amplifier 222. The sixth switch S6 may be turned on in response to the first control signal Q1, which is coupled between the non-inversion input terminal and the negative output terminal of the operational amplifier 222.

The feedback capacitor 226 may be coupled in parallel with the reset switch 224 between the input terminal and the output terminal of the operational amplifier 222. The feedback capacitor 226 may include third and fourth capacitors C3, C4 coupled in parallel with the fifth and sixth switches S5 and S6, individually.

The offset compensation circuit 230 may form a first path between the input terminal and the output terminal of the amplification circuit 220 in response to the first control signal Q1 to store the offset occurred at the input terminal of the amplification circuit 220. In addition, the offset compensation circuit 230 may form a second path between the input terminal and the output terminal of the amplification circuit 220 in response to the second control signal Q2 to reflect stored offset to the output terminal of the amplification circuit 220. The offset compensation circuit 230 may include a compensation capacitor 232, a first path switch 234, and a second path switch 236.

The compensation capacitor 232 may include a fifth capacitor C5 coupled to the inversion input terminal of the operational amplifier 222 and a sixth capacitor C6 coupled to the non-inversion input terminal of the operational amplifier 222. In the sampling and holding operation, the fifth and sixth capacitors C5, C6 may be coupled in parallel with the third and fourth capacitors C3 and C4. According to an embodiment, the third to sixth capacitors C3, C4, C5, C6 may have the same capacitance.

The first path switch 234 may include seventh and eighth switches S7, S8. The seventh switch S7 may be coupled between the fifth capacitor C5 and the negative output terminal of the operational amplifier 222. The seventh switch S7 may be turned on in response to the first control signal Q1. The eighth switch S8 may be coupled between the sixth capacitor C6 and the positive output terminal of the operational amplifier 222. The eighth switch S8 may be turned on in response to the first control signal Q1.

The second path switch 236 may include ninth and tenth switches S9, S10. The ninth switch S9 may be connected between the fifth capacitor C5 and the positive output terminal of the operational amplifier 222. The ninth switch S9 may be turned on in response to the second control signal Q2. The tenth switch S10 may be coupled between the sixth capacitor C6 and the negative output terminal of the operational amplifier 222. The tenth switch S10 may be turned on in response to the second control signal Q2.

According to an embodiment of the present disclosure, while the compensation capacitor 232 and the first path switch 234 constitute an offset storage circuit, the compensation capacitor 232 and the second path switch 236 may constitute an offset reflection circuit. That is, the compensation capacitor 232 may be shared by the offset storage circuit and the offset reflection circuit. Hereinafter, an operation of the offset compensation circuit 230 will be described in more detail with reference to FIGS. 3 and 4.

Figure 3:
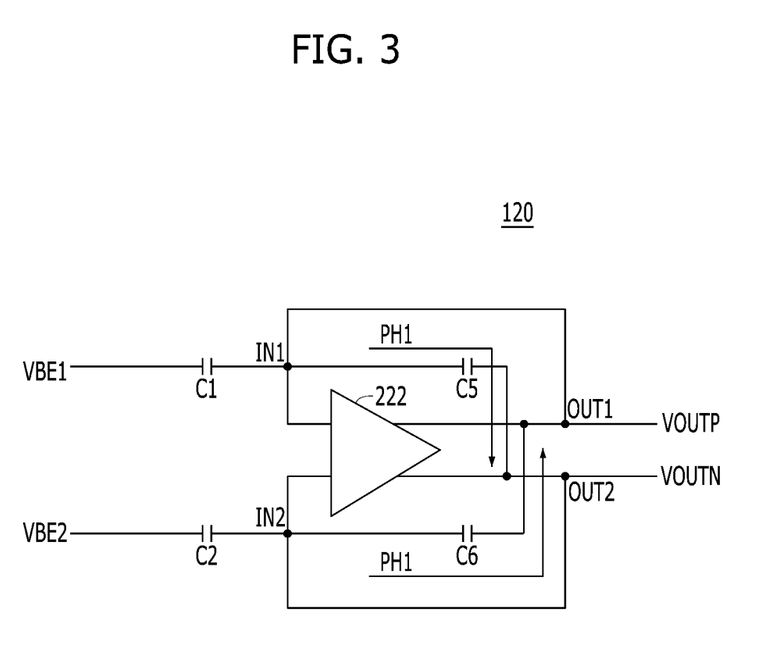
FIG. 3 is a circuit diagram showing a switching connection in a sampling operation of the sample-and-hold amplification circuit shown in FIG. 2.
Figure 4:
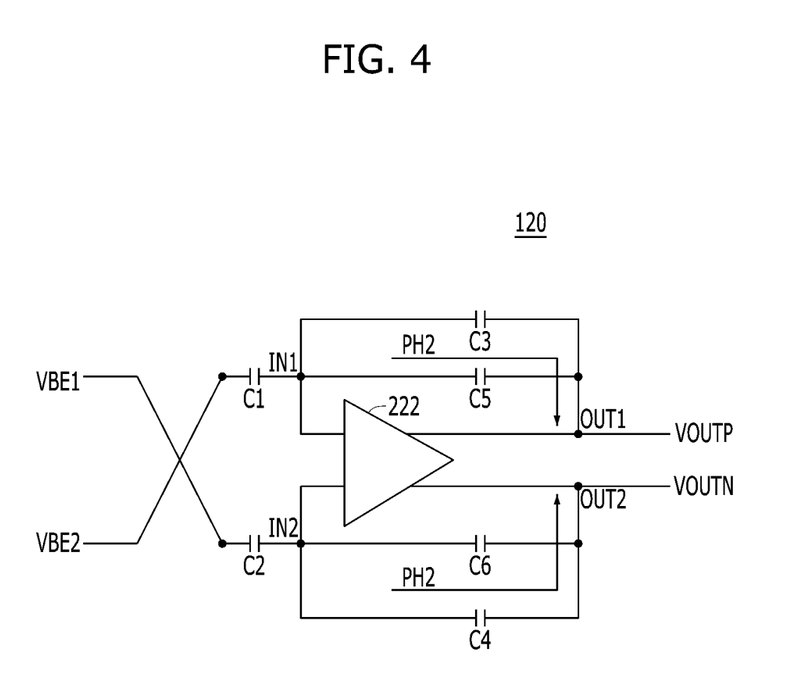
FIG. 4 is a circuit diagram showing a switching connection in a holding operation of the sample-and-hold amplification circuit shown in FIG. 2.

FIG. 3 is a circuit diagram showing a switching connection in a sampling operation of the sample-and-hold amplification circuit 120 shown in FIG. 2. FIG. 4 is a circuit diagram showing a switching connection in a holding operation of the sample-and-hold amplification circuit 120 shown in FIG. 2. FIGS. 3 and 4 describes equivalent circuit interpretation of the sample-and-hold amplification circuit 120 shown in FIG. 2.

Referring to FIG. 3, when the first control signal Q1 is activated during the sampling operation, the first sampling switch 212 in FIG. 2 may transfer the first and second analog input signals VBE1, VBE2. The sampling capacitor 216 may sample transferred first and second analog input signals VBE1, VBE2. For example, the sampling capacitor 216 may be charged with a voltage corresponding to the transferred first and second analog input signals VBE1, VBE2. In this case, input terminals IN1, IN2 and output terminals OUT1, OUT2 of the operational amplifier 222 may be coupled and reset through a feedback loop formed by the reset switch 224. That is, residual charges, which may remain at the output terminals OUT1, OUT2 of the operational amplifier 222 during a holding operation previously performed, may be removed so that the operational amplifier 222 may be initialized.

According to an embodiment of the present disclosure, the offset storage circuit 232, 234 may form a first path PH1 between the first input terminal IN1 and the second output terminal OUT2 and between the second input terminal IN2 and the first output terminal OUT1 of the operational amplifier 222, in response to the first control signal Q1. That is, in response to the first control signal Q1, the seventh and eighth switches S7, S8 may be turned on, while the ninth and tenth switches S9, S10 may be turned off. Accordingly, the compensation capacitors C5, C6 are coupled via the first path PH1 formed between the first and second input terminals IN1, IN2 and the first and second output terminals OUT1, OUT2 of the operational amplifier 222, so that the compensation capacitors C5, C6 may be charged with a voltage corresponding to the offsets occurred at the input terminals IN1, IN2.

Referring to FIG. 4, when the second control signal Q2 is activated in the holding operation, the second sampling switch 214 in FIG. 2 may transfer the first and second analog input signals VBE1, VBE2 to the sampling capacitor 216. The holding operation and the sampling operation may be performed alternatively. The sampling capacitor 216 may be charged twice based on a voltage corresponding to the first and second analog input signals VBE1, VBE2 accumulatively and continuously after the sampling capacitor 216 is charged in the sampling operation.

Signals corresponding to the voltage accumulated in the sampling capacitor 216 are applied to the input terminals IN1, IN2 of the operational amplifier 222, and the reset switch 224 may be turned off. Accordingly, the operational amplifier 222 may generate the first and second output signals VOUTP, VOUTN amplified according to a capacitance ratio of the sampling capacitor 216 and the feedback capacitor 226, based on the first and second analog input signals VBE1, VBE2.

According to an embodiment of the present disclosure, the offset reflection circuit 232, 236 may form a second path PH2 between the first input terminal IN1 and the first output terminal OUT1 and between the second input terminal IN2 and the second input terminal OUT2 of the operational amplifier 222, in response to the second control signal Q2. That is, in response to the second control signal Q2, the ninth and tenth switches S9, S10 may be turned on, while the seventh and eighth switches S7, S8 may be turned off. Accordingly, the compensation capacitors C5, C6 may be coupled via the second path PH2 formed between the input terminals IN1, IN2 and the output terminals OUT1, OUT2 of the operational amplifier 222, so that charged voltage may be reflected to the output terminals OUT1, OUT2 of the operational amplifier 222.

Figure 5A:
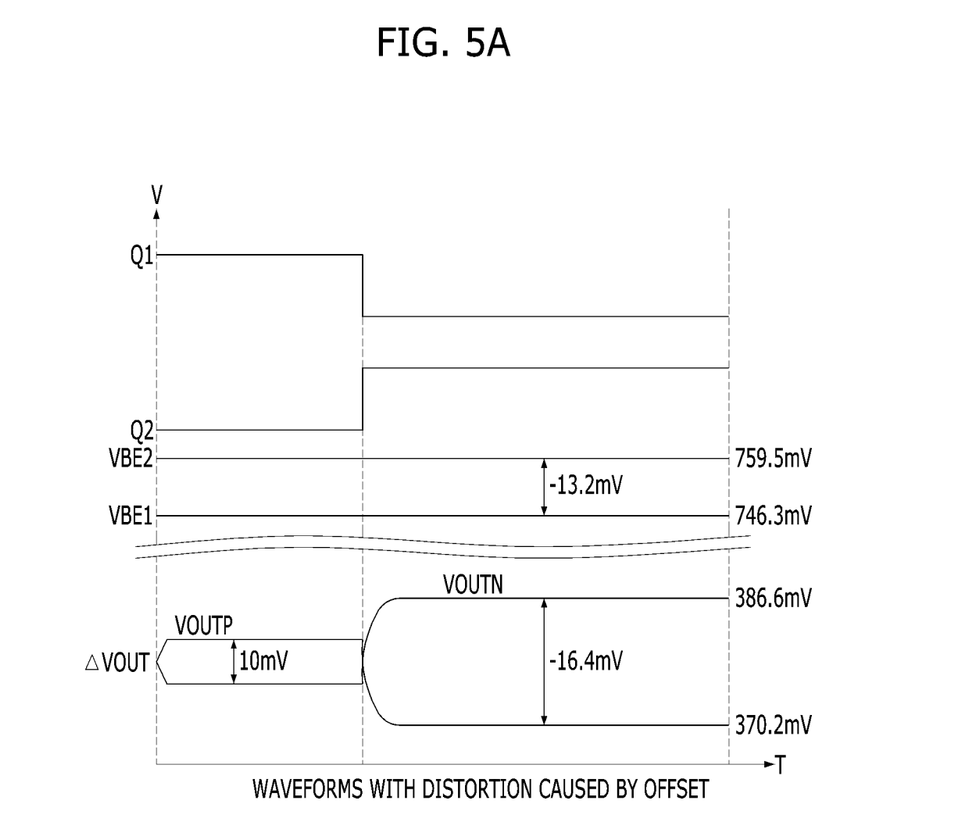
FIGS. 5A and 5B are output waveform diagrams showing an operation of a sample-and-hold amplification circuit according to an embodiment of the present disclosure.
Figure 5B:
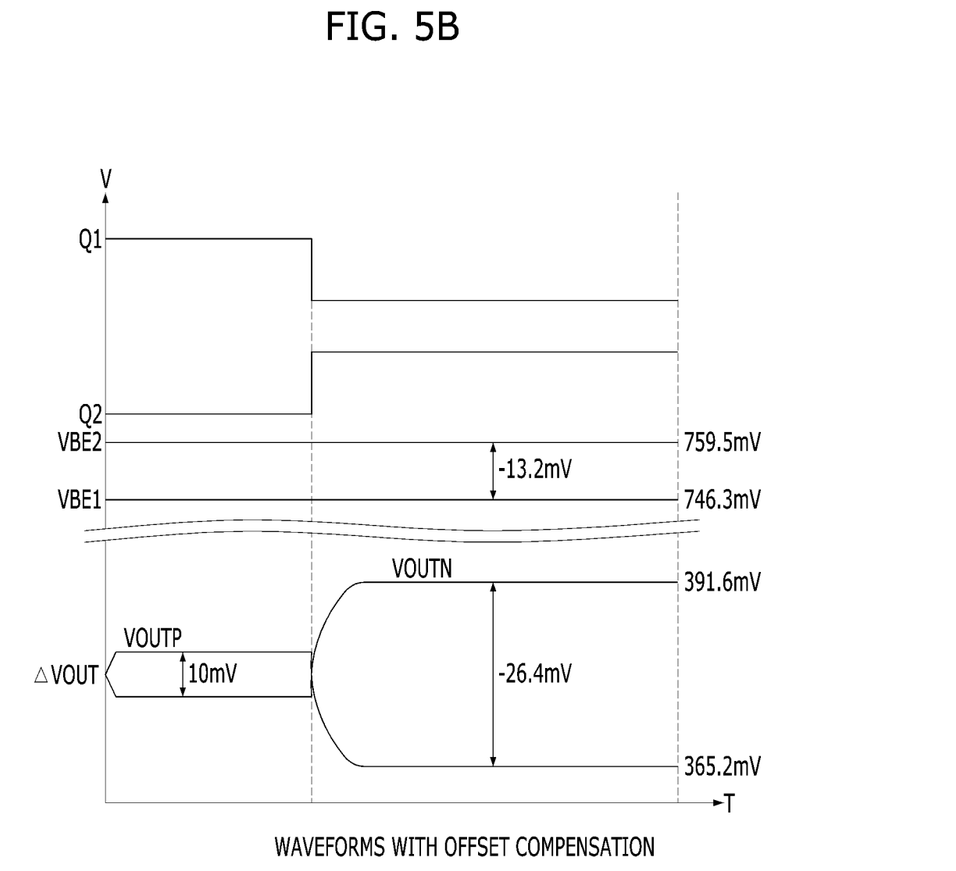

FIGS. 5A and 5B are output waveform diagrams showing an operation of the sample-and-hold amplification circuit 120 according to an embodiment of the present disclosure. FIG. 5A shows a waveform of first and second output signals VOUTP, VOUTN changed due to an offset, and FIG. 5B shows a waveform of first and second output signals VOUTP, VOUTN with offset compensation according to an embodiment of the present disclosure.

The operational amplifier 222 may include various electronic components such as a transistor. An offset voltage may be generated due to a difference between characteristics of transistors or a parasitic capacitance occurred between the electronic components. FIGS. 5A and 5B show as an example that an offset voltage of 10 mV is generated at the input terminals IN1, IN2 of the operational amplifier 222.

According to an embodiment, the first and second control signals Q1, Q2 may include two clock signals that are non-overlapped with each other, that is, have complementary phases. For example, the first control signal Q1 is a clock signal activated in the sampling operation, but the second control signal Q2 is a clock signal activated in the holding operation. Accordingly, when the first control signal Q1 is activated, the sample and hold amplification circuit 120 performs a sampling operation. When the second control signal Q2 is activated, the sample and hold amplification circuit 120 performs a holding operation.

When the offset is not compensated, that is, when the offset compensation circuit 230 does not operate and the first control signal Q1 is activated during the sampling operation, the input terminals IN1, IN2 and the output terminals OUT1, OUT2 of the operational amplifier 222 may be coupled via a feedback loop formed by the reset switch 224. Accordingly, due to the offset voltages which occurred at the input terminals IN1, IN2 of the operational amplifier 222, the first and second output signals VOUTP, VOUTN may have a voltage difference of 10 mV.

If there is a voltage difference between the first and second output signals VOUTP, VOUTN (e.g., the voltage difference is not 0V), the operational amplifier 222 receiving the input signals might not amplify the input signals at a preset ratio when the second control signal Q2 is activated to start the holding operation. Referring to the waveform diagram of FIG. 5A, it can be shown that a voltage difference between the first and second output signals VOUTP, VOUTN is −16.4 mV which is decreased by 10 mV from an expected output difference.

It may be described in more detail using an equation that the operation of the sample-and-hold amplification circuit 120 is distorted due to the offset.

First, amounts of charges $Q_{IP}$, $Q_{IN}$ charged in the sample-and-hold amplification circuit 120 in the sampling operation may be expressed as following equations.

$$Q_{IP}=(V_{BE1}-V_{SP1}) \cdot C_1$$

$$Q_{IN}=(V_{BE2}-V_{SP2}) \cdot C_2$$

Herein, voltage levels $V_{BE1}$, $V_{BE2}$, $V_{SP1}$, $V_{SP2}$ corresponds to the voltage level of the first and second analog input signals VBE1, VBE2 and the first and second sampling signals VSP1, VSP2, individually. The capacitances $C_1$, $C_2$ corresponds to capacitances of the first and second capacitors C1, C2, which may have the same value.

Subsequently, amounts of charges $Q_{FP}$, $Q_{FN}$ charged in the sample-and-hold amplification circuit 120 in the holding operation may be expressed as follows.

$$Q_{FP}=(V_{BE2}-V_{SP1}) \cdot C_1+(V_{OUTP}-V_{SP1}) \cdot C_3$$

$$Q_{FN}=(V_{BE1}-V_{SP2}) \cdot C_2+(V_{OUTN}-V_{SP2}) \cdot C_4$$

Herein, voltage levels $V_{OUTP}$, $V_{OUTN}$ correspond to the voltage levels of the first and second output signals VOUTP, VOUTN, individually. The capacitances $C_3$, $C_4$ may correspond to capacitances of the third and fourth capacitors C3, C4, which may have the same value.

In the sampling and holding operation, the amounts of charges in the sample and hold amplification circuit 120 may be preserved, that is, $Q_{IP}=Q_{FP}$ and $Q_{IN}=Q_{FN}$, so that each of the first and second output signals VOUTP, VOUTN may be determined by the following equations. Finally, a voltage difference ($V_{OUTP}-V_{OUTN}$) between the first and second output signals VOUTP, VOUTN may be obtained by the following equations.

$$V_{OUTP} = (V_{BE1} - V_{BE2}) \cdot \frac{C_1}{C_3} + V_{SP1}$$

$$V_{OUTN} = (V_{BE2} - V_{BE1}) \cdot \frac{C_2}{C_4} + V_{SP2}$$

$$V_{OUTP} - V_{OUTN} = (V_{BE1} - V_{BE2}) \cdot 2\frac{C_1}{C_3} + V_{SP1} - V_{SP2}$$

For example, based on the above equations, all capacitances of the first and second capacitors C1 and C2 and the third and fourth capacitors C3 and C4 are 140 fF. Referring to the waveform of FIG. 5A, when the voltage difference ($V_{BE1}-V_{BE2}$) of the first and second analog input signals VBE1, VBE2 is (−13.2×2), mV=(746.3 mV−759.5 mV). But it could be seen that a voltage difference ($V_{OUTP}-V_{OUTN}$) between the first and second output signals VOUTP and VOUTN is −16.4 mv, which is reduced by 10 mV as the offset voltage ($V_{SP1}-V_{SP2}$) from the voltage difference (−13.2×2) mV.

According to an embodiment of the present disclosure, the input terminals IN1, IN2 and the output terminals OUT1, OUT2 of the operational amplifier 222 are coupled in the sampling operation. Similarly, the first and second output signals VOUTP, VOUTN may have a voltage difference of 10 mV. However, in response to the first control signal Q1, a first path PH1 is formed between the input terminals IN1, IN2 and the output terminals OUT1, OUT2 of the operational amplifier 222, so that the compensation capacitor 232 may be charged with the offset voltage of 10 mV at the input terminals IN1, IN2 of the amplifier 222.

Subsequently, when the second control signal Q2 is activated to start the holding operation, a second path PH2 is formed between the input terminals IN1, IN2 and the output terminals OUT1, OUT2 of the operational amplifier 222, so that the offset voltage of 10 mV charged in the compensation capacitor 232 may be reflected to the output terminals OUT1, OUT2 of the operational amplifier 222. Therefore, referring to the waveform diagram of FIG. 5B, although the first and second output signals VOUTP, VOUTN have a voltage difference of 10 mV during the sampling operation, the offset voltage may be compensated for according to the holding operation. It could be seen that the first and second output signals VOUTP, VOUTN may be output with a voltage difference of −26.4 mV.

The operation of the sample-and-hold amplification circuit 120 according to offset compensation may be described in more detail using following equations.

First, amounts of charges charged in the sample-and-hold amplification circuit 120 during the sampling operation may be expressed as following equations.

$$Q_{IP}=(V_{BE1}-V_{SP1}) \cdot C_1+(V_{SP2}-V_{SP1}) \cdot C_5$$

$$Q_{IN}=(V_{BE2}-V_{SP2}) \cdot C_2+(V_{SP1}-V_{SP2}) \cdot C_6$$

At this time, the capacitances $C_5$, $C_6$ may correspond to capacitances of the fifth and sixth capacitors C5, C6, which may have the same value. Further, the fifth and sixth capacitors C5, C6 may have the same capacitance as the third and fourth capacitors C3, C4 (C3=C4=C5=C6).

Subsequently, the amounts of charges $Q_{FP}$, $Q_{FN}$ charged in the sample-and-hold amplification circuit 120 in the holding operation may be expressed as following equations.

$$Q_{FP}=(V_{BE2}-V_{SP1}) \cdot C_1+(V_{OUTP}-V_{SP1}) \cdot (C_3+C_5)$$

$$Q_{FN}=(V_{BE1}-V_{SP2}) \cdot C_2+(V_{OUTN}-V_{SP2}) \cdot (C_4+C_6)$$

As described above, because the amounts of charges of the sample-and-hold amplification circuit 120 may be preserved, that is, $Q_{IP}=Q_{FP}$ and $Q_{IN}=Q_{FN}$, so that each of the first and second output signals VOUTP, VOUTN may be determined by the following equations. Finally, a voltage difference ($V_{OUTP}-V_{OUTN}$) between the first and second output signals VOUTP, VOUTN may be obtained by the following equations.

$$V_{OUTP} = (V_{BE1} - V_{BE2}) \cdot \frac{C_1}{C_3+C_5} + (V_{SP2} - V_{SP1}) \cdot \frac{C_5}{C_3+C_5} + V_{SP1}$$

$$V_{OUTN} = (V_{BE2} - V_{BE1}) \cdot \frac{C_2}{C_4+C_6} + (V_{SP1} - V_{SP2}) \cdot \frac{C_6}{C_4+C_6} V_{SP2}$$

$$V_{OUTP} - V_{OUTN} =$$

$$(V_{BE1} - V_{BE2}) \cdot \frac{C_1}{C_3} + (V_{SP2} - V_{SP1}) \cdot 2\frac{1}{2} + V_{SP1} - V_{SP2} = (V_{BE1} - V_{BE2}) \cdot \frac{C_1}{C_3}$$

For example, based on the above equations, the first and second capacitors C1, C2 have a capacitance of 140 fF and the third to sixth capacitors C3 to C6 have a capacitance of 70 fF. Referring to the waveform of FIG. 5B, when the voltage difference ($V_{BE1}-V_{BE2}$) of the first and second analog input signals VBE1, VBE2 is −13.2 mV=(746.3 mV−759.5 mV), it could be seen that the voltage difference ($V_{OUTP}-V_{OUTN}$) between the first and second the output signals VOUTP, VOUTN may be −26.4=(−13.2×2) mV after being compensated for the offset voltage ($V_{SP1}-V_{SP2}$).

According to an embodiment of the present disclosure, a sample-and-hold amplification circuit may form different paths between input and output terminals during sampling and holding operations. At the output terminal of the sample-and-hold amplifier circuit, the sample-and-hold amplifier circuit may compensate for an offset which may have occurred at the input terminal. Thus, the sample-and-hold amplifier circuit may include different switching paths for the sampling and holding operations, so that the offset may be compensated for on the output signal. Accordingly, an embodiment may provide a high-precision sample-and-hold amplification circuit, so that an analog signal may be sampled without distortion and converted into a digital signal.

While the present teachings have been illustrated and described with respect to the specific embodiments, it will be apparent to those skilled in the art in light of the present disclosure that various changes and modifications may be made without departing from the spirit and scope of the disclosure as defined in the following claims. Furthermore, the embodiments may be combined to form additional embodiments.

What is claimed is:

1. A sample-and-hold amplification circuit, comprising:
a sampling circuit configured to sample first and second input signals in response to first and second control signals to generate first and second sampled signals;
an amplification circuit configured to amplify a voltage difference between the first and second sampled signals to generate first and second output signals; and
an offset compensation circuit configured to form a first path between input and output terminals of the amplification circuit in response to the first control signal to store an offset of the input terminal and form a second path between the input and output terminals in response to the second control signal to reflect the offset to the output terminal, wherein the offset compensation circuit comprises a compensation capacitor which is coupled between the input and output terminals of the amplification circuit via the first path when the first control signal is activated or the second path when the second control signal is activated.

2. The sample-and-hold amplification circuit according to claim 1, wherein the offset compensation circuit comprises:
an offset storage circuit configured to form the first path between a first input terminal and a second output terminal of the amplification circuit and between a second input terminal and a first output terminal of the amplification circuit, in response to the first control signal; and
an offset reflection circuit configured to form the second path between the first input terminal and the first output terminal of the amplification circuit and between the second input terminal and the second terminal of the amplification circuit, in response to the second control signal.

3. The sample-and-hold amplification circuit according to claim 2, wherein the offset storage circuit comprises:
first and second capacitors individually coupled to the first and second output terminals of the amplification circuit;
a first switch coupled between the first capacitor and the second output terminal of the amplification circuit and configured to be turned on in response to the first control signal; and
a second switch coupled between the second capacitor and the first output terminal of the amplification circuit and configured to be turned on in response to the first control signal.

4. The sample-and-hold amplification circuit according to claim 3, wherein the offset reflection circuit comprises:
the first and second capacitors;
a third switch coupled between the first capacitor and the first output terminal of the amplification circuit and configured to be turned on in response to the second control signal; and
a fourth switch coupled between the second capacitor and the second output terminal of the amplification circuit and configured to be turned on in response to the second control signal.

5. The sample-and-hold amplification circuit according to claim 1, wherein the sampling circuit comprises:
a first sampling switch turned on in response to the first control signal to transfer the first and second input signals;
a second sampling switch turned on in response to the second control signal to transfer the first and second input signals; and
a sampling capacitor between the first and second sampling switches and the amplification circuit.

6. The sample-and-hold amplification circuit according to claim 5, wherein the first sampling circuit comprises:
a first switch turned on in response to the first control signal to transfer the first input signal to a first capacitor of the sampling capacitor; and
a second switch turned on in response to the first control signal to transfer the second input signal to a second capacitor of the sampling capacitor.

7. The sample-and-hold amplification circuit according to claim 6, wherein the second sampling circuit comprises:

a third switch turned on in response to the second control signal to transfer the first input signal to the second capacitor of the sampling capacitor; and
a fourth switch turned on in response to the second control signal to transfer the second input signal to the first capacitor of the sampling capacitor.

8. The sample-and-hold amplification circuit according to claim 1, wherein the first and second control signals comprise two clock signals having phases which are complementary to each other and are not overlapped with each other.

9. The sample-and-hold amplification circuit according to claim 1, wherein the amplification circuit comprises:
an operational amplifier coupled between the input terminal and the output terminal to generate the first and second output signals;
a reset switch turned on in response to the first control signal to form a feedback loop between the input terminal and the output terminal; and
a feedback capacitor coupled in parallel with the reset switch between the input terminal and the output terminal.

10. The sample-and-hold amplification circuit according to claim 9, wherein the compensation capacitor is coupled in parallel with the feedback capacitor when the second control signal is activated.

11. The sample-and-hold amplification circuit according to claim 9, wherein the compensation capacitor and the feedback capacitor have the same capacitance.

12. A semiconductor device, comprising:
a temperature sensing circuit configured to generate first and second input signals, wherein a voltage difference between the first and second input signals increases in a proportion to temperature;
an amplification circuit configured to amplify the voltage difference between the first and second input signals to generate first and second output signals; and
an analog-to-digital conversion circuit configured to convert a voltage difference between the first and second output signals into a digital signal including information of the temperature,
wherein the amplification circuit is further configured to form a first path between input and output terminals of the amplification circuit in response to the first control signal to store an offset of the input terminal and form a second path between the input and output terminals in response to the second control signal to reflect the offset to the output terminal, and
wherein the amplification circuit comprises a compensation capacitor which is coupled between the input and output terminals of the amplification circuit via the first path when the first control signal is activated or the second path when the second control signal is activated.

13. The semiconductor device according to claim 12, wherein the amplification circuit comprises:
an offset storage circuit configured to form the first path between a first input terminal and a second output terminal of the amplification circuit and between a second input terminal and a first output terminal of the amplification circuit, in response to the first control signal; and
an offset reflection circuit configured to form the second path between the first input terminal and the first output terminal of the amplification circuit and between the second input terminal and the second output terminal of the amplification circuit, in response to the second control signal.

14. The semiconductor device according to claim 12, wherein the amplification circuit comprises:
    an operational amplifier coupled between the input terminal and the output terminal to generate the first and second output signals;
    a reset switch turned on in response to the first control signal to form a feedback loop between the input terminal and the output terminal; and
    a feedback capacitor coupled in parallel with the reset switch between the input terminal and the output terminal.

15. The semiconductor device according to claim 14, wherein the compensation capacitor and the feedback capacitor have the same capacitance.

16. The semiconductor device according to claim 12, wherein the first and second control signals comprise two clock signals having phases which are complementary to each other and are not overlapped with each other.

* * * * *